United States Patent
Hoshi et al.

(10) Patent No.: US 9,610,753 B2
(45) Date of Patent: Apr. 4, 2017

(54) GAS BARRIER FILM AND ELECTRONIC DEVICE

(71) Applicants: Sinichi Hoshi, Kawagoe (JP); Shigeto Okuji, Tokyo (JP)

(72) Inventors: Sinichi Hoshi, Kawagoe (JP); Shigeto Okuji, Tokyo (JP)

(73) Assignee: Lintec Corporation, Tokyo (JP)

( * ) Notice: Subject to any disclaimer, the term of this patent is extended or adjusted under 35 U.S.C. 154(b) by 139 days.

(21) Appl. No.: 14/177,143

(22) Filed: Feb. 10, 2014

(65) Prior Publication Data

US 2014/0150864 A1    Jun. 5, 2014

Related U.S. Application Data

(63) Continuation of application No. 13/260,418, filed as application No. PCT/JP2010/001898 on Mar. 17, 2010, now abandoned.

(30) Foreign Application Priority Data

Mar. 31, 2009  (JP) ................................ 2009-083871

(51) Int. Cl.
  *B32B 27/06*  (2006.01)
  *B32B 33/00*  (2006.01)
  (Continued)

(52) U.S. Cl.
  CPC .............. *B32B 27/06* (2013.01); *B32B 33/00* (2013.01); *C08J 7/045* (2013.01); *C23C 14/024* (2013.01);
  (Continued)

(58) Field of Classification Search
  None
  See application file for complete search history.

(56) References Cited

U.S. PATENT DOCUMENTS 6,335,479 B1    1/2002  Yamada et al.
2009/0214854 A1  8/2009  Okawara et al.
(Continued)

FOREIGN PATENT DOCUMENTS

CN    1535203 A    10/2004
CN    101039801 A    9/2007
(Continued)

OTHER PUBLICATIONS

Zhang et al., "Dynamic ion mixing deposition of niobium nitride films by cathodic arc plasma in ambient nitrogen," J. Vac. Sci. Technol. A 19(5) 2001, pp. 2048-2050.*
(Continued)

*Primary Examiner* — Catherine S Branch
(74) *Attorney, Agent, or Firm* — Christopher Casieri (57) ABSTRACT

Disclosed is a gas barrier film, which demonstrates superior gas barrier properties and surface flatness, demonstrates a high degree of adhesion between layers and is resistant to cracking when bent, and an electronic device provided therewith. A gas barrier film (10) of the present invention has a base (11), and a polyorganosiloxane layer (12) and an inorganic material layer (13) sequentially provided on at least one side of the base (11), and the inorganic material layer (13) is deposited by dynamic ion mixing method.

19 Claims, 2 Drawing Sheets (51) Int. Cl.
  *H01L 31/048* (2014.01)
  *C08J 7/04* (2006.01)
  *C23C 14/02* (2006.01)
  *C23C 14/34* (2006.01)
  *C23C 14/06* (2006.01)
  *C23C 14/08* (2006.01)
  *H01L 31/049* (2014.01)

(52) U.S. Cl.
  CPC ...... *C23C 14/0641* (2013.01); *C23C 14/0652* (2013.01); *C23C 14/08* (2013.01); *C23C 14/345* (2013.01); *C23C 14/3485* (2013.01); *H01L 31/049* (2014.12); *C08J 2367/02* (2013.01); *C08J 2483/04* (2013.01); *Y02E 10/50* (2013.01); *Y10T 428/263* (2015.01); *Y10T 428/265* (2015.01); *Y10T 428/31663* (2015.04)

(56) References Cited

U.S. PATENT DOCUMENTS

| | | |
|---|---|---|
| 2009/0214882 A1 | 8/2009 | Sakakura |
| 2011/0083726 A1 | 4/2011 | Takayanagi et al. |

FOREIGN PATENT DOCUMENTS

| | | |
|---|---|---|
| JP | 10-305542 A | 11/1998 |
| JP | 2005-289052 A | 10/2005 |
| JP | 2006-001156 A | 1/2006 |
| JP | 2007-111974 A | 5/2007 |
| JP | 2008-246894 A | 10/2008 |
| JP | 2009-262490 A | 11/2009 |
| JP | 2009-2622490 A | 11/2009 |
| TW | 200603181 A | 1/2006 |
| WO | 2010004932 A1 | 1/2010 |

OTHER PUBLICATIONS

Jin et al., "Structure and adhesion of ZrN films formed by reactive magnetron sputtering ion plating and dynamic ion mixing," J. Appl. Phys. 74(4), 1993, pp. 2886-2891.*
Office Action for corresponding Taiwanese Application No. 099108671 dated May 12, 2014, with English translation.
Author Unknown; Search Report for European Application No. 10758187.8 mailed Nov. 29, 2013.
Author Unknown; English Abstract of CN 1535203 A; 1 page; [online]; State Intellectual Property Office of P.R.C.; obtained Sep. 24, 2013.
Author Unknown; English Abstract of CN 101039801 A; 1 page; [online]; Espacenet; http://worldwide.espacenet.com/publicationDetails/biblio?DB=worldwide.espacent.com; obtained Sep. 17, 2013.
Author Unknown; Office Action and Search report from corresponding Chinese patent application No. 201080014715.2 issued Jul. 2, 2013; pp. 1-6; State Intellectual Property Office of the People's Republic of China.
Wang, Yigang; English translation of Search Report issued with Office Action from corresponding Chinese patent application No. 201080014715.2; issued Jul. 2, 2013; 2 pages; State Intellectual Property Office of the People's Republic of China.
English Abstract of JP 10-305542 A, (Nov. 17, 1998).
English Abstract of JP 2005-289052 A, (Oct. 20, 2005).
Halling, "Surface Coating Technology—The Ion Plating Process," The Production Engineer, Mar. 1977.
Office Action from U.S. Appl. No. 13/260,418 issued May 10, 2013.
Office Action from U.S. Appl. No. 13/260,418 issued Sep. 11, 2013.
Advisory Action from U.S. Appl. No. 13/260,418 issued Jan. 2, 2014.

* cited by examiner

GAS BARRIER FILM AND ELECTRONIC DEVICE

This application is a continuation of U.S. application Ser. No. 13/260,418 filed on Sep. 26, 2011, which is a 371 application of PCT/JP2010/001898, filed Mar. 17, 2010, which, in turn, claims priority of Japanese Patent Application No. 2009-083871, filed on Mar. 31, 2009.

TECHNICAL FIELD

The present invention relates to a gas barrier film and an electronic device provided with that gas barrier film.

The present application claims priority on the basis of Japanese Patent Application No. 2009-083871 filed in Japan on Mar. 31, 2009, the contents of which are incorporated herein by reference.

BACKGROUND ART

Transparent resin films have been attempted to be used in recent years as an alternative to glass substrates in applications such as image display elements or solar cell modules accompanying requirements for increased flexibility, lighter weight and reduced thickness.

Figure 5:
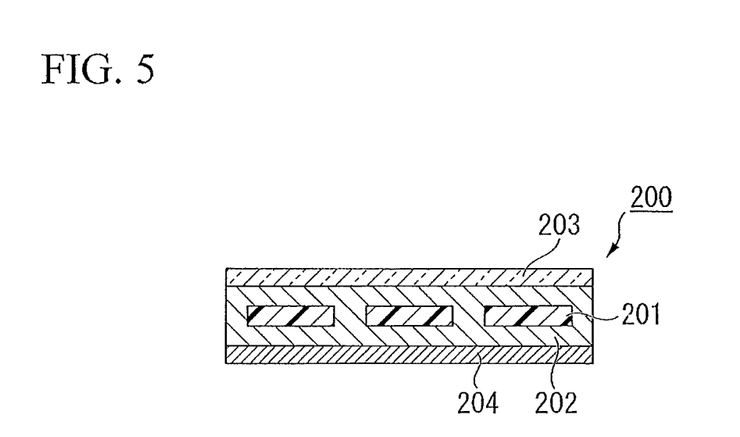
FIG. 5 is a schematic longitudinal cross-sectional view showing a solar cell module that uses a transparent resin film as a protective sheet.

FIG. 5 is a schematic cross-sectional view showing an example of a solar cell module in which a transparent resin film is used as a protective sheet.

This solar cell module 200 is generally composed of a solar cell 201 composed of crystalline silicon or amorphous silicon and the like, an encapsulant (filler layer) composed of an electrical insulator that seals the solar cell 201, a front protective sheet (front sheet) 203 laminated onto the front of the encapsulant 202, and a back protective sheet (back sheet) 204 laminated onto the back of the encapsulant 202.

In order to impart weather resistance and durability to the solar cell module 200 enabling it to withstand outdoor and indoor use over a long period of time, it is necessary to protect the solar cell module 201 and the encapsulant 202 from wind and rain, humidity, debris and mechanical impacts while also maintaining the inside of the solar cell module 200 in a sealed state that is completely isolated from the outside air. Consequently, the front sheet 203 and the back sheet 204 are required to have superior weather resistance, and are required to have a low level of water vapor permeability (superior gas barrier properties) in particular.

However, transparent resin films have poor gas barrier properties in comparison with glass substrates, and are unable to adequately prevent entrance of water vapor into solar modules as is. In addition, since transparent resin films have low surface flatness, when an electrode film is deposited on the surface thereof, protrusions that cause disconnections or short circuits are formed in the electrode film.

Therefore, a film (gas barrier film) has been proposed that is imparted with gas barrier properties by laminating an inorganic thin film having gas barrier properties onto a synthetic resin film by sputtering method and the like (see, for example, Patent Document 1).

However, although conventional gas barrier films have improved gas barrier properties in comparison with transparent resin films alone, they are still considered to be adequately satisfactory. In addition, the inorganic thin film is subject to the occurrence of cracking when the gas barrier films are bent, thereby resulting in the risk of gas easily permeating the film at locations where cracking has occurred.

In order to solve this problem of the occurrence of cracking caused by bending of the film, a technique has been proposed that makes the inorganic thin film resistant to cracking by alternately laminating an inorganic thin film and organic thin film on a synthetic resin sheet (see, for example, Patent Document 2). However, in addition the production process of this film being complex, adhesion between the inorganic thin film and organic thin film is low, thereby resulting in increased susceptibility to separation of the thin films.

PRIOR ART DOCUMENTS

Patent Documents

Patent Document 1: Japanese Unexamined Patent Application, First Publication No. H10-305542
Patent Document 2: Japanese Laid-Open Patent Application, First Publication No. 2005-289052

SUMMARY OF THE INVENTION

Problems to be Solved by the Invention

With the foregoing in view, an object of the present invention is to provide a gas barrier film having superior gas barrier properties and surface flatness in which layers are securely adhered and is resistant to the occurrence of cracking when the gas barrier film is bent, and to provide an electronic device provided with this gas barrier film.

Means for Solving the Problems

As a result of conducting extensive studies to solve the aforementioned problems, the inventors of the present invention found that by providing a layer containing a polyorganosiloxane-based compound on a base, and depositing an inorganic material layer thereon by dynamic ion mixing method, a gas barrier film can be obtained that has superior gas barrier properties and surface flatness in which the layers are securely adhered and is resistant to the occurrence of cracking when the gas barrier film is bent, thereby leading to completion of the present invention.

Namely, the present invention is a gas barrier film having a base, and a layer containing a polyorganosiloxane-based compound and an inorganic material layer sequentially laminated on at least one side of the base, wherein the inorganic material layer is deposited by dynamic ion mixing method.

In addition, in the present invention, an inorganic compound that composes the inorganic material layer is preferably at least one type of inorganic compound selected from the group consisting of an elemental metal, silicon, graphite, inorganic oxide, inorganic nitride and inorganic oxynitride.

In addition, in the present invention, the inorganic compound is preferably at least one type of inorganic compound selected from the group consisting of silicon nitride, silicon oxide, silicon oxynitride, aluminum oxide, aluminum nitride, aluminum oxynitride, indium oxide and tin-doped indium oxide.

In addition, in the present invention, a plasma-forming gas used in the dynamic ion mixing method is preferably contains at least one type of gas selected from the group consisting of helium, argon, neon, krypton and xenon.

In addition, in the present invention, the plasma-forming gas used in the dynamic ion mixing method is preferably a mixed gas further containing at least one type of gas selected from the group consisting of hydrogen, oxygen, nitrogen and fluorocarbons.

In addition, in the present invention, the dynamic ion mixing method is preferably carried out by applying a negative high voltage of −50 kV to −1 kV to the base in pulses.

In addition, in the present invention, the thickness of the layer containing a polyorganosiloxane-based compound is preferably 0.01 μm to 100 μm.

In addition, in the present invention, the polyorganosiloxane-based compound of the layer containing a polyorganosiloxane-based compound is preferably polydimethylsiloxane.

In addition, in the present invention, a layer containing a fluorine-containing resin is preferably provided on the base on the side opposite the side where the layer containing a polyorganosiloxane-based compound is formed.

In addition, the present invention provides a gas barrier film, wherein the content of the polyorganosiloxane-based compound in the layer containing a polyorganosiloxane-based compound is preferably 50% by weight or more.

In addition, the present invention provides a gas barrier film, wherein the thickness of the inorganic material layer is preferably 10 nm to 1000 nm.

In addition, the present invention is an electronic device provided with the aforementioned gas barrier film.

In addition, in the present invention, the electronic device is preferably a solar cell module.

In addition, in the present invention, the gas barrier film is preferably used as a back protective sheet.

In addition, in the present invention, the electronic device is preferably an image display element.

Effects of the Invention

According to the gas barrier film of the present invention, since surface irregularities in the surface of the base are filled in by a layer containing a polyorganosiloxane-based compound provided on the base, the shape of surface irregularities in the surface of the base are inhibited from standing out on the surface. Consequently, this gas barrier film allows the obtaining of high surface flatness.

In addition, as a result of providing the inorganic material layer on the layer containing a polyorganosiloxane-based compound and depositing the inorganic material layer by dynamic ion mixing method, the layer containing a polyorganosiloxane-based compound and the inorganic material layer are securely adhered, thereby inhibiting layer separation. When carrying out processing using the gas barrier film of the present invention, the gas barrier film can be applied to a processing apparatus having a small diameter roll, thereby facilitating handling.

In addition, since the inorganic material layer deposited by dynamic ion mixing method has few pinholes, superior gas barrier properties, and is resistant to the occurrence of cracking when the film is bent, the gas barrier properties thereof can be maintained over a long period of time. Moreover, since both the inorganic material layer and the layer containing a polyorganosiloxane-based compound have gas barrier properties, this gas barrier film allows the obtaining of extremely superior gas barrier properties.

In addition, according to the electronic device of the present invention, as a result of being provided with a gas barrier film as described above, gas such as water vapor which is present outside the electronic device is reliably prevented from entering inside the electronic device, thereby allowing the obtaining of superior weather resistance and durability. In addition, even in the case of having a process by which an electrode film is deposited on the surface of a gas barrier film, since the surface flatness of the gas barrier film is high, the formation of protrusions on the electrode film during the deposition process is prevented, thereby making it possible to avoid disconnections and short circuits attributable to the protrusions on the electrode film.

EMBODIMENTS OF THE INVENTION

The following provides an explanation of embodiments of the present invention with reference to the drawings.

<Gas Barrier Film>

An explanation is first provided of embodiments of the gas barrier film of the present invention.

Figure 1:
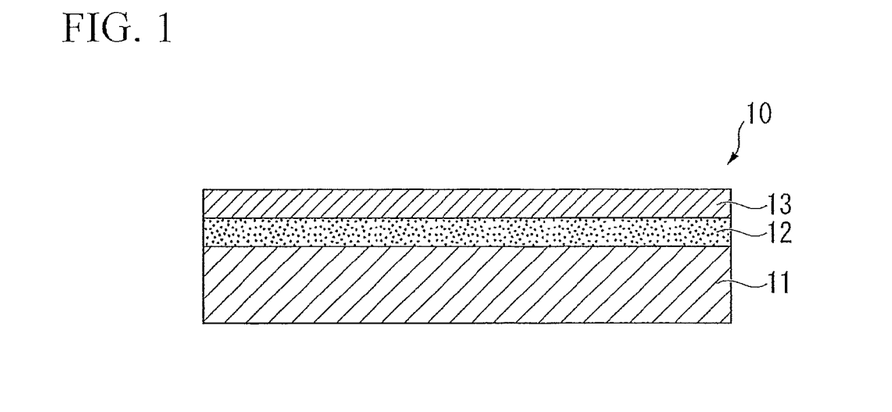
FIG. 1 is a schematic longitudinal cross-sectional view showing a first embodiment of the gas barrier film of the present invention.
Figure 2:
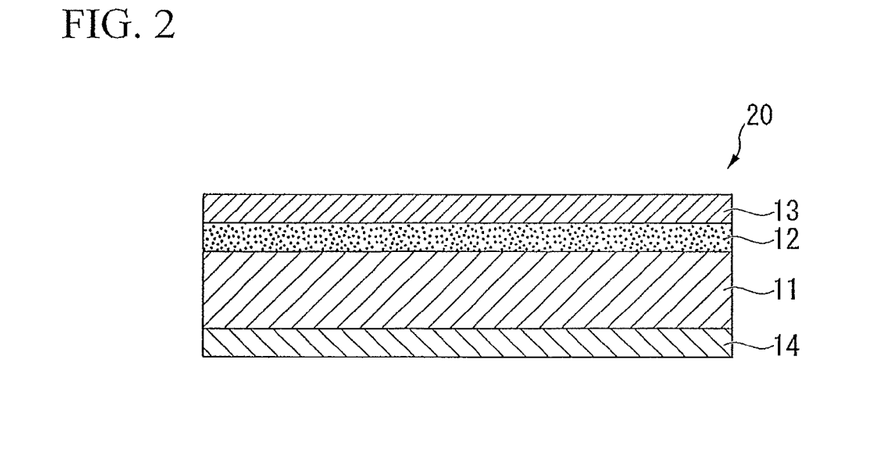
FIG. 2 is a schematic longitudinal cross-sectional view showing a second embodiment of the gas barrier film of the present invention.
Figure 3:
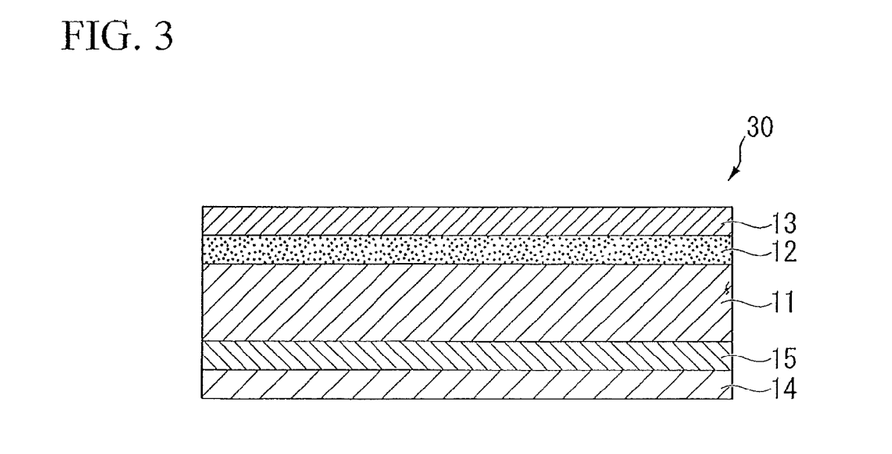
FIG. 3 is a schematic longitudinal cross-sectional view showing a third embodiment of the gas barrier film of the present invention.

FIG. 1 is a schematic longitudinal cross-sectional view showing a first embodiment of the gas barrier film of the present invention. FIG. 2 is a schematic longitudinal cross-sectional view showing a second embodiment of the gas barrier film of the present invention. FIG. 3 is a schematic longitudinal cross-sectional view showing a third embodiment of the gas barrier film of the present invention.

A gas barrier film 10 shown in FIG. 1 has a base 11, and a layer 12 containing a polyorganosiloxane-based compound (to be referred to as the "polyorganosiloxane layer") and an inorganic material layer 13 sequentially laminated on the base 11. This gas barrier film 10 is arranged so that, for example, the side of the inorganic material layer 13 is on the side of the electronic device in the case of being applied to an electronic device.

The following provides an explanation of the configuration of each constituent.

The base 11 supports each constituent that composes the gas barrier film.

Although there are no particular limitations on the material used to compose the base 11 provided it is able to satisfy the required level of performance of an electronic device in which the gas barrier film is applied, a resin film is preferable since it is advantageous in terms of reducing weight and increasing flexibility while also being able to be applied to roll-to-roll production. However, the base 11 is not limited thereto, but rather may also be in the form of a glass plate or metal plate. Examples of materials of the resin film include polyimide, polyamide, polyamidoimide, polyphenylene ether, polyether ketone, polyether ether ketone, polyolefin, polyester, polycarbonate, polysulfone, polyethersulfone, polyphenylene sulfide, polyarylate, acrylic resin, alicyclic structure-containing polymers and aromatic polymers, and the like, and one type thereof can be used alone or two or more types can be used in combination. In addition, among these resins, polyester and polyamide are used particularly preferably from the viewpoints of versatility, transparency and heat resistance.

Examples of polyesters include polyethylene terephthalate (PET), polybutylene terephthalate, polyethylene naphthalate and polyarylate, and the like.

Examples of polyamides include completely aromatic polyamides, Nylon 6, Nylon 66 and nylon copolymers, and the like.

Although there are no particular limitations thereon, the thickness of the base 11 is normally 1 μm to 1000 μm, preferably 5 μm to 500 μm, and in consideration of practicality, 10 μm to 200 μm.

In addition to functioning as a surface smoothing layer that prevents surface irregularities in the surface of the base 11 from appearing on the surface by filling in surface irregularities in the surface of the base 11, the polyorganosiloxane layer 12 also functions as a gas barrier layer that obstructs the migration of gas such as water vapor from one side to the other side across the polyorganosiloxane layer 12.

The polyorganosiloxane-based compound contained in the polyorganosiloxane layer 12 is a compound obtained by polycondensation of a silane compound having a hydrolyzable functional group.

There are no particular limitations on the main chain structure of the polyorganosiloxane-based compound, and may be in the form of a linear chain, ladder or cage.

For example, an example of a linear main chain structure is the structure represented by the following formula (a), an example of a ladder main chain structure is the structure represented by the following formula (b), and an example of a cage main chain structure is the structure represented by the following formula (c).

[Chemical Formula 1]

(a)

[Chemical Formula 2]

(b)

[Chemical Formula 3]

(c)

In the above formulas, Rx, Ry and Rz respectively and independently represent a hydrogen atom or a non-hydrolyzable group such as an unsubstituted or substituted alkyl group, unsubstituted or substituted alkenyl group or unsubstituted or substituted aryl group. Furthermore, a plurality of Rx in formula (a), a plurality of Ry in formula (b) and a plurality of Rz in formula (c) may be the same or different each other. However, both of the Rx of formula (a) may not be hydrogen atoms.

Examples of alkyl groups of the unsubstituted or substituted alkyl group include alkyl groups having 1 to 10 carbon atoms, such as a methyl group, ethyl group, n-propyl group, isopropyl group, n-butyl group, isobutyl group, sec-butyl group, t-butyl group, n-pentyl group, isopentyl group, neopentyl group, n-hexyl group, n-heptyl group or n-octyl group.

Examples of alkenyl groups include alkenyl groups having 2 to 10 carbon atoms, such as a vinyl group, 1-propenyl group, 2-propenyl group, 1-butenyl group, 2-butenyl group or 3-butenyl group.

Examples of substituents of the alkyl groups and alkenyl groups include halogen atoms such as a fluorine atom, chlorine atom, bromine atom or iodine atom, hydroxyl groups, thiol groups, epoxy groups, glycidoxy groups, (meth)acryloyloxy groups, and unsubstituted or substituted aryl groups such as a phenyl group, 4-methylphenyl group or 4-chlorophenyl group.

Examples of aryl groups of the unsubstituted or substituted aryl groups include aryl groups having 6 td 10 carbon atoms, such as a phenyl group, 1-naphthyl group or 2-naphthyl group.

Examples of substituents of the aryl groups include halogen atoms such as a fluorine atom, chlorine atom, bromine atom or iodine atom, alkyl groups having 1 to 6 carbon atoms such as a methyl group or ethyl group, alkoxy groups having 1 to 6 carbon atoms such as a methoxy group or ethoxy group, nitro groups, cyano groups, hydroxyl groups, thiol groups, epoxy groups, glycidoxy groups, (meth)acryloyloxy groups, and unsubstituted or substituted aryl groups such as a phenyl group, 4-methylphenyl group or 4-chlorophenyl group.

Among these, Rx, Ry and Rz are preferably a hydrogen atom, alkyl group having 1 to 6 carbon atoms or phenyl group, and particularly preferably an alkyl group having 1 to 6 carbon atoms.

In the present invention, the polyorganosiloxane-based compound is preferably a linear compound represented by the aforementioned formula (a), and is particularly preferably polydimethylsiloxane in which the two Rx in formula (a) are both methyl groups from the viewpoints of ease of availability and allowing the formation of a polyorganosiloxane compound layer having superior gas barrier properties.

Polyorganosiloxane-based compounds can be obtained by a known production method consisting of, for example, polycondensation of a silane compound having a hydrolyzable functional group.

The silane compound used is suitably selected corresponding to the structure of the target polyorganosiloxane-based compound. Preferable specific examples include bifunctional silane compounds such as dimethyldimethoxysilane, dimethyldiethoxysilane, diethyldimethoxysilane or diethyldiethoxysilane, trifunctional silane compounds such as methyltrimethoxysilane, methyltriethoxysilane, ethyltrimethoxysilane, ethyltriethoxysilane, n-propyltrimethoxysilane, n-butyltriethoxysilane, phenyltrimethoxysilane, phenyltriethoxysilane or phenyldiethoxymethoxysilane, and tetrafunctional silane compounds such as tetramethoxysilane, tetraethoxysilane, tetra-n-propoxysilane, tetraisopropoxysilane, tetra-n-butoxysilane, tetra-t-butoxysilane, tetra-s-butoxysilane, methoxytriethoxysilane, dimethoxydiethoxysilane or trimethoxyethoxysilane.

In addition, compounds available commercially as release agents, adhesives or sealants and the like can also be used as is for the polyorganosiloxane-based compound.

The polyorganosiloxane layer 12 may also contain other components within a range that does not impair the object of the present invention in addition to the polyorganosiloxane-based compound. Examples of other components include curing agents, catalysts, other polymers, aging prevention agents, photostabilizers and flame retardants.

Furthermore, from the viewpoint of allowing the obtaining a laminate having superior gas barrier properties, the content of the polyorganosiloxane-based compound in the polyorganosiloxane layer 12 is preferably 50% by weight or more and more preferably 70% by weight or more.

There are no particular limitations on the method used to form the polyorganosiloxane layer 12, and can be produced by, for example, coating a layer-forming solution, containing at least one type of polyorganosiloxane-based compound, other components as necessary, and a solvent and the like, onto a suitable base 11, and heating (drying) the resulting coated film as necessary.

The film thickness of the polyorganosiloxane layer 12 is preferably 0.01 µm to 100 µm, more preferably 0.02 µm to 10 µm and particularly preferably 0.03 µm to 1 µm. In the case the film thickness is less than 0.01 µm, there is the possibility of being unable to adequately obtain the functions of the polyorganosiloxane layer 12 as a gas barrier layer and surface smoothing layer as previously described. In addition, in the case the film thickness of the polyorganosiloxane layer 12 exceeds 100 µm, corresponding effects are unable to be obtained and the resulting effects are opposite from those of reducing weight and decreasing thickness of the gas barrier film 10, thereby making this undesirable.

The inorganic material layer 13 is provided on the polyorganosiloxane layer 12.

The inorganic material layer 13 functions as a gas barrier layer that obstructs the migration of gas such as water vapor from one side to the other side across the inorganic material layer 13.

Although there are no particular limitations on the inorganic compound that composes the inorganic material layer 13 provided it is able to obstruct the permeation of water vapor and other gas, examples thereof include an elemental metal, silicon, graphite, inorganic oxide, inorganic nitride and inorganic oxynitride. Among these, silicon nitride, silicon oxide, silicon oxynitride, aluminum oxide, aluminum nitride, aluminum oxynitride, indium oxide and tin-doped indium oxide are preferable.

In the present invention, the inorganic material layer 13 is deposited by dynamic ion mixing method.

Here, dynamic ion mixing method refers to a method of depositing a compound film consisting of a film-forming material and an implanted ion species by simultaneously carrying out film formation and ion implantation. This dynamic ion mixing method facilitates film composition control and crystal control by simply altering the conditions of film formation and ion implantation, and by optimizing these conditions, allows the deposition of a film that has few pinholes and has superior mechanical characteristics. In addition, during the early stages of film formation, a portion of the atoms of the film-forming material that have reached the surface of a film-deposited base are energized as a result of colliding with ions implanted in the film, enabling them to be knocked on to the film-deposited base. As a result, a mixed layer of atoms that compose the film-deposited base and atoms of the film-forming material is formed at the interface between the film-deposited base and the film. In this mixed layer, atoms of the film-forming material that have entered the film-deposited base have a structure in the manner of driving a wedge into the film-deposited base, and function as anchors that secure the deposited film to the film-deposited base. Consequently, the deposited film is securely adhered to the film-deposited base.

Thus, the inorganic material layer 13 that has been deposited by dynamic ion mixing method is securely adhered to the polyorganosiloxane layer 12, thereby inhibiting separation from the polyorganosiloxane layer 12. In addition, since the inorganic material layer 13 has few pinholes, in addition to allowing the obtaining of superior gas barrier properties, is resistant to the occurrence of cracking when the film is bent, thereby making it possible to maintain the gas barrier properties thereof over a long period of time.

Although there are no particular limitations on the deposition method used for dynamic ion mixing method, sputtering method is used preferably. As a result, the inorganic material layer 13 can be deposited that is more securely adhered to the polyorganosiloxane layer 12.

The inorganic material layer 13 is formed in the manner described below, for example, in the case of dynamic ion mixing method using a sputtering method.

First, the base 11 provided with the polyorganosiloxane layer 12 and a target is arranged in a vacuum chamber. After pressure inside the vacuum chamber has been reduced, plasma-forming gas is introduced into the vacuum chamber.

The plasma-forming gas contains a sputter gas (rare gas) and an gas capable of ionization (ionization (reactive gas) other than the rare gas as necessary, and plasma is formed by applying radio frequency electrical power to the base 11.

Next, together with applying the radio frequency electrical power to the base 11, a negative direct current high voltage is successively applied in pulses.

As a result of the radio frequency electrical power being applied to the base 11, the plasma-forming gas is plasmatized around the base 11, ions of the sputter gas present in the plasma collide with the target, and sputtered particles are scattered from the target. The scattered sputtered particles adhere to and accumulate on the surface of the polyorganosiloxane layer 12 resulting in the formation of a deposited film of sputtered particles (film obtained from the target material). In addition, simultaneous thereto, as a result of applying a negative direct current high voltage to the base 11 in pulses, ions in the plasma are attracted to the base 11 and are implanted in the deposited film. As a result, energy is imparted to the atoms that compose the film, causing the atoms to be knocked on to the polyorganosiloxane layer 12. In the case of using a reactive gas, in addition to the atoms being knocked on to the polyorganosiloxane layer 12, the atoms that compose the film also react with ions of the reactive gas. As a result, a compound film (inorganic material layer 13) of the target material and the reactive gas is formed on the polyorganosiloxane layer 12 while securely adhered thereto.

Furthermore, in this dynamic ion mixing method, a charge of the base caused by ion implantation can be removed by applying radio frequency electrical power to the base 11.

In the dynamic ion mixing method as described above, the target and the plasma-forming gas are suitably selected corresponding to the composition of the desired inorganic material layer 13.

More specifically, examples of the target include an elemental metal, silicon, graphite or metal-containing compound (such as an oxide, nitride or oxynitride) that composes the target inorganic material layer.

In addition, examples of the sputter gas in the plasma-forming gas include helium, argon, neon, krypton and xenon, and one type thereof can be used alone or two or more types can be used in combination. In addition, examples of the reactive gas include hydrogen, oxygen, nitrogen and fluorocarbons, and one type thereof can be used alone or two or more types can be used in combination.

In the case of reactive sputtering, the plasma-forming gas is preferably composed mainly of the sputter gas, and although varying according to the composite ratio of the target material and the desired film quality, the ratio of sputter gas in the introduced gas is specifically preferably 50% to 100%, more preferably 55% to 98%, and particularly preferably 60% to 96%. As a result, the film deposition rate can be increased and the inorganic material layer 13 can be deposited efficiently.

In addition, the pressure of the plasma-forming gas (or total pressure in the case of a mixed gas) is preferably $1.0 \times 10^1$ to $1.0 \times 10^{-3}$ Pa, more preferably $1.0 \times 10^0$ to $1.0 \times 10^{-3}$ Pa and particularly preferably $1.0 \times 10^0$ to $1.0 \times 10^{-2}$ Pa.

The negative pulsed high voltage applied to the base 11 is preferably $-100$ kV to $-100$ V, more preferably $-50$ kV to $-1$ kV and particularly preferably $-20$ kV to $-1$ kV.

In addition, the concentration of ions implanted in the film is normally $1 \times 10^{15}$ ions/cm$^2$ or more, preferably $1 \times 10^{16}$ ions/cm$^2$ or more, and more preferably $1 \times 10^{16}$ to $1 \times 10^{18}$ ions/cm$^2$.

As a result of using these conditions, the inorganic material layer 13 can be deposited that is securely adhered to the polyorganosiloxane layer 12 and has superior gas barrier properties and bendability (referring to being able to be bent easily but being resistance to the occurrence of cracks when the film is bent).

Although there are no particular limitations on the thickness of the inorganic material layer 13, it is preferably 10 nm to 1000 nm, more preferably 20 nm to 500 nm and particularly preferably 50 nm to 200 nm. In the case the thickness of the inorganic material layer 13 is less than the aforementioned ranges, there is the possibility of being unable to obtain adequate gas barrier properties. In addition, in the case the thickness of the inorganic material layer 13 exceeds the aforementioned ranges, transparency of the gas barrier film 10 is impaired, thus presenting a problem in the case of using as a front sheet of a solar cell module or in the case of arranging on the display surface of an image display element such as a liquid crystal display element or organic EL display element.

In the gas barrier film 10 composed in the manner described above, as a result of providing the polyorganosiloxane layer 12 on the base 11, surface irregularities in the surface of the base 11 are filled in, and the shape of surface irregularities in the surface of the base 11 are inhibited from appearing on the surface. Consequently, this gas barrier film 10 allows the obtaining of high surface flatness.

In addition, as a result of the inorganic material layer 13 being provided on the polyorganosiloxane layer 12, and the inorganic material layer 13 being deposited by dynamic ion mixing method, a high degree of adhesion is obtained between the polyorganosiloxane layer 12 and the inorganic material layer 13, thereby inhibiting layer separation.

In addition, since the inorganic material layer 13 deposited by dynamic ion mixing method has few pinholes, has superior gas barrier properties. Since it is resistance to the occurrence of cracking when the film is bent, the gas barrier properties thereof can be maintained over a long period of time. Moreover, since both the inorganic material layer 13 and the polyorganosiloxane layer 12 have gas barrier properties, the gas barrier film 10 allows the obtaining extremely superior gas barrier properties.

In this manner, although this gas barrier film 10 has superior surface flatness and gas barrier properties, more specifically, center line average roughness (Ra) and water vapor permeability preferably have the values indicated below.

First, although there are no particular limitations thereon, the center line average roughness (Ra) of the surface of the gas barrier film 10 (surface of the inorganic material layer 13) is preferably 2.0 nm or less, more preferably 1.0 nm or less and particularly preferably 0.5 nm or less. Here, center line average roughness (Ra) is the value obtained by expanding to 3 dimensions that defined in JIS B0601 so as to be able to be applied to a measurement plane, and averaging absolute values of deviation from a reference plane to the measurement plane, and is represented by the following formula:

$$R_a = \frac{1}{S_0} \int_{Y_B}^{Y_T} \int_{X_L}^{X_R} |F(X,Y) - Z_0| dX dY \qquad \text{[Equation 1]}$$

(wherein,

F(X,Y) is the plane indicating all measurement data, $S_0$ is the area when a specified plane is assumed to be ideally flat, and $Z_0$ is the average value of Z data within the specified plane).

This center line surface roughness (Ra) is an indicator of surface flatness of the inorganic material layer 13, and means that the smaller this value, the higher the surface flatness. As a result of the centerline surface roughness (Ra) of the inorganic material layer 13 being within the aforementioned ranges, even in the case of applying the gas barrier film 10 to an electronic device having a configuration in which an electrode film is provided on the surface thereof, protrusions are prevented from being formed on the electrode film and disconnections and short-circuits caused by these protrusions can be avoided.

In addition, although there are no particular limitations thereon, the water vapor permeability of the gas barrier film 10 is preferably 1.0 g/m²/day or less, more preferably 0.5 g/m²/day and particularly preferably 0.1 g/m²/day. As a result of the water vapor permeability of the gas barrier film 10 being within the aforementioned ranges, when the gas barrier film 10 is applied to various types of electronic devices, water vapor and other gas on the outside can be reliably inhibited from entering into the electronic device, thereby making it possible to greatly improve the weather resistance and durability of the electronic device.

In addition, although there are no particular limitations thereon, the total light transmittance of the gas barrier film 10 is preferably 60% or more, more preferably 70% or more and particularly preferably 75% or more. As a result of the total light transmittance of the gas barrier film 10 being within the aforementioned ranges, when the gas barrier film 10 is used as a front sheet of a solar cell module, light from the outside is able to efficiently enter the solar cell. In addition, when the gas barrier film 10 is arranged on the display surface of a liquid crystal display element or organic EL display element, an image displayed on that display surface can be in visual contact distinctly.

Here, although the polyorganosiloxane layer 12 and the inorganic material layer 13 are provided on only one side of the base 11 in the gas barrier film 10 explained above, each of these layers may also be provided on both sides of the base 11. As a result, the gas barrier properties of the gas barrier film 10 can be further enhanced.

In addition, as shown in FIGS. 2 and 3, gas barrier films 20 and 30 of the present invention may be provided with the polyorganosiloxane layer 12 and the inorganic material layer 13 on one side of the base 11 and provided with another layer on the other side.

An example of another layer is a layer containing a fluorine-containing resin (to be referred to as a "fluorine-containing resin layer") 14. Fluorine-containing resins are resistant to adherence of water due to their high water repellency. Consequently, the providing of the fluorine-containing resin layer 14 on the other side of the base 11 makes it possible to obtain more superior gas barrier properties by reducing the amount of water vapor that reaches the other surface of the base 11.

The fluorine-containing resin layer 14 can be formed by, for example, (i) a method in which a coating material containing a fluorine-containing resin is coated and dried on the base 11 followed by carrying out post-treatment as necessary as shown in FIG. 2, or (ii) a method in which film containing a fluorine-containing resin (fluorine-containing resin layer 14) is adhered to the surface of the base 11 with an adhesive 15 as shown in FIG. 3.

Preferable examples of fluorine-containing resins include polymers composed mainly of chlorotrifluoroethylene (CTFE), such as Lumiflon (trade name) manufactured by Asahi Glass Co., Ltd., Cefral Coat (trade name) manufactured by Central Glass Co., Ltd., or Fluonate (trade name) manufactured by DIC Corp., polymers composed mainly of tetrafluoroethylene (TFE) such as Zeffle (trade name) manufactured by Daikin Industries, Ltd., polymers having fluoroalkyl groups such as Zonyl (trade name) manufactured by E. I. DuPont de Nemours and Co. or Unidyne (trade name) manufactured by Daikin Industries, Ltd., and polymers composed mainly of fluoroalkyl units. Among these, polymer composed mainly of CTFE and polymers composed mainly of TFE are more preferable from the viewpoints of weather resistance and pigment dispersibility, with Lumiflon (trade name) and Zeffle (trade name) being the most preferable.

<Production Method of Gas Barrier Film>

Next, an explanation is provided of a method of producing the gas barrier film shown in FIG. 1.

First, the base 11 is prepared, and the polyorganosiloxane layer 12 is formed on the base 11.

Examples of methods of forming the polyorganosiloxane layer 12 include (i) a method in which a coating material containing a polyorganosiloxane-based compound is coated and dried on the base 11 followed by carrying out post-treatment as necessary, and (ii) a method in which a film containing a polyorganosiloxane-based compound is adhered to the surface of the base 11 with an adhesive.

Among these methods, the method of (i) is used preferably. According to the method of (i), the polyorganosiloxane layer 12 can be continuously formed on an elongated base 11, thereby allowing the obtaining of high production efficiency.

Formation of the polyorganosiloxane layer 12 according to the method of (i) is specifically carried out by using a film conveying system that conveying the base 11 in one direction, and a polyorganosiloxane layer forming apparatus having a coating device and a heating device arranged at intermediate locations of the film conveying system.

First, a coating material containing a polyorganosiloxane-based compound is prepared.

Although there are no particular limitations on the solvent used to prepare the coating material provided it dissolves the polyorganosiloxane and is resistant to dissolving the base, examples include methyl ethyl ketone (MEK), cyclohexanone, acetone, methyl isobutyl ketone (MIBK), toluene, xylene, methanol, isopropanol, ethanol, heptane, ethyl acetate, isopropyl acetate, n-butyl acetate and n-propyl alcohol, and one type of these can be used alone or two or more types can be used in combination. In particular, xylene, cyclohexanone or MEK is used preferably from the viewpoints of solubility of contained components in the coating material and low persistency (low boiling point temperature) in the resulting coated film.

Furthermore, the coating material may also contain components other than the polyorganosiloxane-based compound.

The coating material is then placed in a coating material tank of the coating device and an elongated base 11 is placed across the film conveying system. While conveying the base 11 in one direction, the coating material containing the polyorganosiloxane-based compound is coated onto one side of the base 11 with the coating device, and then the coating material is dried with the heating device. As a result, the polyorganosiloxane layer 12 is continuously formed on the elongated base 11.

Next, the inorganic material layer 13 is formed on the polyorganosiloxane layer 12 by dynamic ion mixing method. The following provides an explanation of the method of forming the inorganic material layer 13 by using as an example the case of forming a silicon oxynitride layer by dynamic ion mixing method using a sputtering method.

First, the base 11 on which the polyorganosiloxane layer 12 has been formed is placed across the film conveying system provided in the chamber, and a silicon target is placed in the chamber. At this time, the base 11 is positioned so that the side on which the polyorganosiloxane layer 12 has been formed is face the target at an intermediate location of the film conveying system.

After having reduced the pressure inside the chamber with a rotary pump and an oil diffusion vacuum pump, the plasma-forming gas is introduced. Here, a mixed gas of argon, nitrogen and oxygen is used for the plasma-forming gas.

Radio frequency electrical power is then applied to the base 11 while conveying the base 11 together with applying a direct current high voltage is successively applied in pulses. For example, radio frequency electrical power of 13.56 MHz that has been pulse-modulated to 10 µs to 400 ms is applied to the base 11.

As a result of applying the radio frequency electrical power to the base 11, plasma-forming gas is plasmatized around the base 11, argon ions in the plasma collide with the silicon target, and silicon particles are scattered from the target. The scattered silicon particles adhered to the surface of the polyorganosiloxane layer 12 and are deposited thereon resulting in the formation of a deposited film of silicon particles. In addition, as a result of a negative direct current high voltage simultaneously being applied in pulses to the base 11, ions in the plasma are attracted to the base 11 and are implanted in the deposited film. As a result, silicon atoms that compose the film being energized by the ions are knocked on to the polyorganosiloxane layer 12, and silicon atoms that compose the film react with ions of the reactive gas (nitrogen and oxygen), resulting in the formation of silicon oxynitride. As a result, a silicon oxynitride layer is formed that is securely adhered to the polyorganosiloxane layer.

This type of film formation process is carried out continuously along the lengthwise direction of the base 11 as it is being transported. As a result, an elongated gas barrier film 10 is completed in which a polyorganosiloxane layer and a silicon oxynitride layer (inorganic material layer) are sequentially laminated.

<Electronic Device>

Next, an explanation is provided of an electronic device in which the gas barrier film of the present invention is applied (electronic device of the present invention) by using a solar cell module as an example thereof.

Figure 4:
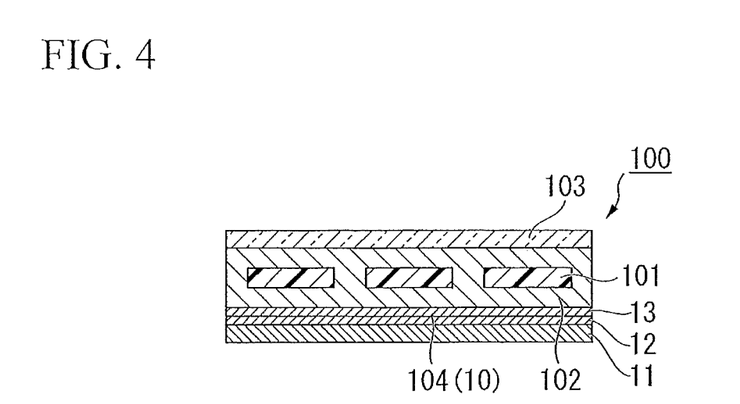
FIG. 4 is a schematic longitudinal cross-sectional view showing a solar cell module that applies the gas barrier film of the present invention (electronic device of the present invention).

FIG. 4 is a schematic cross-sectional view showing an example of a solar cell module in which the gas barrier film of the present invention is applied.

As shown in FIG. 4, a solar cell module 100 is roughly composed of a solar cell 101 composed of crystalline silicon or amorphous silicon and the like, an encapsulant (filler layer) 102 composed of an electrical insulator that seals the solar cell 101, a front protective sheet (front sheet) 103 laminated onto the front of the encapsulant 102, and a back protective sheet (back sheet) 104 laminated onto the back of the encapsulant 102.

In this solar cell module 100, when light enters each solar cell 101 from the side of the front sheet 103, optical energy is converted to electrical power in each solar cell 101, and the electrical power is output from an output terminal of each solar cell 101.

In the solar cell module 100 of the present invention, the back sheet 104 is composed of the gas barrier film 10 of the present invention.

Consequently, since the back sheet 104 has superior gas barrier properties, even in the case the solar cell module 100 is subjected to conditions of high temperature and high humidity, water vapor on the outside is inhibited from entering inside the encapsulant 102 and each of the solar cells 101 by this back sheet 104.

In addition, as a result of the polyorganosiloxane layer 12 and the inorganic material layer 13 being securely adhered in the back sheet 104, the base 11 and the polyorganosiloxane layer 12 are prevented from separating from the inorganic material layer 13. Consequently, in this solar cell module 100, the gas barrier properties of the back sheet 104 can be maintained over a long period of time, time-based deterioration of each of the solar cells 101 caused by external water vapor is inhibited, and superior weather resistance and durability, can be obtained.

Although the above has provided an explanation of the gas barrier film and electronic device of the present invention, each of the constituents that compose the gas barrier film and the electronic device in the aforementioned embodiments are merely intended to be exemplary, and can be suitably modified within a range that does not deviate from the scope of the present invention.

For example, the solar cell module 100 may employ a configuration in which the back sheet 104 and the front sheet 103 are composed with the gas barrier film of the present invention. In addition, the gas barrier film may be the gas barrier film 20 shown in FIG. 2 or the gas barrier film 30 shown in FIG. 3.

In addition, the electronic device in which the gas barrier film of the present invention is applied is not limited to a solar cell module. Examples of other electronic devices in which the gas barrier film is applied include a liquid crystal display, organic EL display, inorganic EL display and electronic paper. In these electronic devices as well, superior weather resistance and durability as well as high surface flatness are obtained by using the gas barrier film of the present invention.

EXAMPLES

Although the following provides a more detailed explanation of the present invention through examples thereof, the present invention is not limited by these examples.

Production of Gas Barrier Film

Example 1

A polyethylene terephthalate film (produced by Mitsubishi Plastics, Inc., trade name: PET38 T-100) having a thickness of 38 µm was prepared for use as a base.

Next, a silicone resin (produced by Shin-Etsu Chemical Co., Ltd., trade name: KS847H), mainly composed of polydimethylsiloxane for the polyorganosiloxane-based compound, was coated onto the surface of the base and dried to obtain a polydimethylsiloxane layer (polyorganosiloxane layer) having a thickness of 100 nm.

Next, a silicon nitride (Si—N) film (inorganic material layer) was deposited on the polydimethylsiloxane layer by dynamic ion mixing method using a sputtering method.

The conditions of dynamic ion mixing method are indicated below.

Plasma-forming gas: Mixed gas of argon and nitrogen
Target: Silicon
Plasma-forming gas flow rates: argon: 100 cm$^3$/min (atmospheric pressure: 1.013 hPa, 25° C.), nitrogen: 60 cm$^3$/min (atmospheric pressure 1.013 hPa, 25° C.)
(Radio Frequency Electrical Power)
Frequency: 13.56 MHz
Applied electrical power: 2500 W
(Negative Pulsed High Voltage)
Pulse repetition frequency: 1000 Hz
Applied voltage: −10 kV
Duty ratio: 0.5%
Pulse width: 5 μsec
Chamber internal pressure: 0.2 Pa
Treatment time: 50 sec
Film thickness: 50 nm A gas barrier film was produced according to the process described above.

Example 2

A gas barrier film was produced in the same manner as Example 1 with the exception of using a mixed gas of argon and oxygen for the plasma-forming gas when forming the inorganic material layer, and depositing a silicon oxide (SiO$_2$) film by setting the argon flow rate to 100 sccm and setting the oxygen flow rate to 30 sccm.

Example 3

A gas barrier film was produced in the same manner as Example 1 with the exception of depositing an aluminum nitride (Al—N) film by using aluminum for the target when forming the inorganic material layer.

Example 4

A gas barrier film was produced in the same manner as Example 1 with the exception of depositing a tin-doped indium oxide (ITO) film by using ITO for the target, setting the argon flow rate to 100 sccm and setting the oxygen flow rate to 5 sccm when forming the inorganic material layer.

Example 5

A gas barrier film was produced in the same manner as Example 1 with the exception of changing the applied voltage to −15 kV when forming the inorganic material layer.

Example 6

A fluorine resin coating agent was prepared in the manner described below.
[Procedure for Preparing Fluorine Resin Coating Agent]
120 parts by weight of methyl ethyl ketone, 18.2 parts by weight of hydrophobic silica (Cabot Specialty Chemicals, Inc., trade name: CAB-O-CIL TS-720) and 100 parts by weight of titanium oxide (E. I. du Pont de Nemours and Company, trade name: Ti-Pure R-105) were mixed followed by dispersing for a prescribed amount of time with a disperser or pigment disperser to prepare a pigment dispersion.

Here, a TK Homodisper (Tokushu Kika Kogyo Co., Ltd.) was used for the disperser, while the Heavy Duty Mixer 5410 (Red Devil Equipment Corp., preliminarily filled with 400 parts by weight of zirconia beads) was used for the pigment disperser.

Next, 100 parts by weight of CTFE-based copolymer (Asahi Glass Co., Ltd., trade name: Lumiflon LF200), 10.7 parts by weight of curing agent (Sumika Bayer Urethane Co., Ltd., trade name: Sumidur N3300), 0.004 parts by weight of accelerator (Toyo Ink Co., Ltd., trade name: BXX3778-10) and 110 parts by weight of MEK were blended into 87 parts by weight of the prepared pigment dispersion to prepare a fluorine resin coating agent.

Next, a base on which a polydimethylsiloxane layer and an inorganic material layer were formed was prepared in the same manner as Example 1.

The fluorine resin coating agent was coated onto the opposite side of the base from the side of the deposited layers were formed using a bar coater followed by drying for 1 minute at 120° C. and allowing to stand for 7 days in an environment at a temperature of 23° C. and relative humidity of 50% to obtain a fluorine-containing resin layer.

A gas barrier film was produced according to the process described above.

Example 7

A base on which a polydimethylsiloxane layer and an inorganic material layer were formed was prepared in the same manner as Example 1.

A fluorine-containing resin layer was formed by adhering a fluorine resin film (E. I. du Pont de Nemours and Company, trade name: Tedlar TUB10AAH4) having a thickness of 25 μm to the opposite side of the base from the side of the deposited layers were formed using a polyester-based adhesive (Toyo Ink Co., Ltd., trade name: AD-76P1 and CAT-10L (curing agent)).

A gas barrier film was produced according to the process described above.

Comparative Example 1

A polyethylene terephthalate film (Mitsubishi Plastics, Inc., trade name: PET38 T-100) having a thickness of 38 μm was prepared for use as a base.

Next, a silicon nitride film having a film thickness of 50 nm was formed on the surface of the base by sputtering method.

A gas barrier film was produced according to the process described above.

Comparative Example 2

A gas barrier film was produced in the same manner as Example 1 with the exception of not forming the polydimethylsiloxane layer and forming a silicon nitride film directly on the base using dynamic ion mixing method.

Comparative Example 3

A gas barrier film was produced in the same manner as Example 1 with the exception of forming a layer (thickness: 1 μm) containing urethane acrylate (Arakawa Chemical Industries, Ltd., trade name: Urethane Acrylate 575BC) instead of the polydimethylsiloxane layer.

Comparative Example 4

A gas barrier film was produced in the same manner as Example 7 with the exception of not forming the polydimethylsiloxane layer, and forming a silicon nitride film directly on the base.

Comparative Example 5

A gas barrier film was produced in the same manner as Example 7 with the exception of forming a layer (thickness: 1 μm) containing urethane acrylate (Arakawa Chemical Industries, Ltd., trade name: Urethane Acrylate 575BC) instead of the polydimethylsiloxane layer.

Comparative Example 6

A polydimethylsiloxane layer was formed on a base in the same manner as Example 1.

Next, ionized argon was implanted as plasma ions into the surface of the polydimethylsiloxane layer using a plasma ion implantation apparatus. Furthermore, argon was confirmed to be present at approximately 10 nm from the surface of the layer containing the polydimethylsiloxane by measuring with an X-ray photoelectron spectroscope (XPS).

The conditions used for plasma ion implantation are indicated below.

Plasma-forming gas flow rate: Argon: 100 cm$^3$/min (atmospheric pressure: 1.013 Pa, 25° C.)
(Radio Frequency Power Source)
Frequency: 13.56 MHz
Applied electrical power: 1000 W
(Negative Pulsed High Voltage)
Duty ratio: 0.5%
Repetition frequency: 1000 Hz
Applied voltage: −10 kV
Chamber internal pressure: 0.2 Pa
Line speed: 0.2 m/min Next, a silicon nitride film having a film thickness of 50 nm was formed on the plasma ion-implanted polydimethylsiloxane layer by magnetron sputtering method using a web sputtering apparatus.

A gas barrier film was produced according to the process described above.

Comparative Example 7

A polydimethylsiloxane layer was formed on a base in the same manner as Example 1.

Next, a silicon nitride film having a film thickness of 50 nm was formed on the polydimethylsiloxane layer by magnetron sputtering method using a web sputtering apparatus.

Next, ionized argon was implanted as plasma ions into the surface of the polydimethylsiloxane layer using a plasma ion implantation apparatus. Furthermore, argon was confirmed to be present at approximately 10 nm from the surface of the Si—N film by measuring by XPS. The conditions used for plasma ion implantation were the same as in Comparative Example 6.

A gas barrier film was produced according to the process described above.

Reference Example 1

A polydimethylsiloxane layer was formed on a base in the same manner as Example 1.

Next, ionized argon was implanted as plasma ions into the surface of the polydimethylsiloxane layer using a plasma ion implantation apparatus. Furthermore, argon was confirmed to be present at approximately 10 nm from the surface of the layer containing the polydimethylsiloxane by measuring with an X-ray photoelectron spectroscope (XPS).

The conditions used for plasma ion implantation are indicated below.

Plasma-forming gas flow rate: Argon: 100 cm$^3$/min (atmospheric pressure: 1.013 Pa, 25° C.)
(Radio Frequency Power Source)
Frequency: 13.56 MHz
Applied electrical power: 1000 W
(Negative Pulsed High Voltage)
Duty ratio: 0.5%
Repetition frequency: 1000 Hz
Applied voltage: −10 kV
Chamber internal pressure: 0.2 Pa
Line speed: 0.2 m/min Furthermore, in Examples 1 to 7 and Comparative Examples 2 to 5, ions were confirmed to be implanted in the inorganic material layer by measuring using an X-ray photoelectron spectroscope (XPS, Ulvac-Phi Inc., trade name: Quantum 2000).

A summary of the organic layer, inorganic layer and other layers formed in the examples, comparative examples and reference example is shown in Table 1.

TABLE 1

| | | Inorganic Material Layer | | |
|---|---|---|---|---|
| | Organic Layer | Type | Deposition Method | Other Layers |
| Ex. 1 | Polydimethyl-siloxane layer | Silicon nitride film | Dynamic ion mixing method | — |
| Ex. 2 | Polydimethyl-siloxane layer | Silicon nitride film | Dynamic ion mixing method | — |
| Ex. 3 | Polydimethyl-siloxane layer | Aluminum nitride film | Dynamic ion mixing method | — |
| Ex. 4 | Polydimethyl-siloxane layer | ITO film | Dynamic ion mixing method | — |
| Ex. 5 | Polydimethyl-siloxane layer | Silicon nitride film | Dynamic ion mixing method | — |
| Ex. 6 | Polydimethyl-siloxane layer | Silicon nitride film | Dynamic ion mixing method | Fluorine-containing resin layer |
| Ex. 7 | Polydimethyl-siloxane layer | Silicon nitride film | Dynamic ion mixing method | Fluorine-containing resin film |
| Comp. Ex. 1 | — | Silicon nitride film | Sputtering method | — |
| Comp. Ex. 2 | — | Silicon nitride film | Dynamic ion mixing method | — |
| Comp. Ex. 3 | Urethane acrylate film | Silicon nitride film | Dynamic ion mixing method | — |
| Comp. Ex. 4 | — | Silicon nitride film | Dynamic ion mixing method | Fluorine-containing resin layer |
| Comp. Ex. 5 | Urethane acrylate film | Silicon nitride film | Dynamic ion mixing method | Fluorine-containing resin film |
| Comp. Ex. 6 | Argon-implanted polydimethyl-siloxane layer | Silicon nitride film | Magnetron sputtering method | — |

TABLE 1-continued

|  | Organic Layer | Inorganic Material Layer | | | 
|---|---|---|---|---|
|  |  | Type | Deposition Method | Other Layers |
| Comp. Ex. 7 | Polydimethyl-siloxane layer | Argon-implanted silicon nitride film | Magnetron sputtering method | — |
| Ref. Ex. 1 | Argon-implanted polydimethyl-siloxane layer | — | — | — |

<Evaluation>

The gas barrier films produced in the examples, comparative examples and reference example were evaluated for water vapor permeability, water vapor permeability after a folding test, bendability, surface flatness and adhesion in the manner described below.

(1) Water Vapor Permeability

Water vapor permeability was measured under conditions of a temperature of 40° C. and relative humidity of 90% using a water vapor permeability tester (Lyssy Inc.).

(2) Water Vapor Permeability after Folding Test

The gas barrier film was folded in the center so that the side on which the polydimethylsiloxane layer and inorganic material layer were formed is on the outside by using a piece of pasteboard having a thickness of 1 mm as a support, followed by passing through a laminator (Fujipla Inc., trade name: Lamipacker LPC1502) while folded in this manner. Water vapor permeability was subsequently measured in the same manner as Test (1).

Furthermore, conditions during passage through the laminator were as indicated below.

Temperature: 23° C.

Laminating speed: 5 m/min (3) Occurrence of Cracking after Bending Test (Bendability Test)

The gas barrier film was wound onto a stainless steel rod having an outer diameter of 3 mm so as to contact the surface on the side on which the polydimethylsiloxane layer and inorganic material layer were not formed, followed by moving up and down 10 times on the stainless steel rod. Subsequently, the gas barrier film was removed from the stainless steel rod and the surface on the side on which the polydimethylsiloxane layer and inorganic material layer were formed was observed using a light microscope (Keyence Corp., VHX-100) at a magnification of 2000× to examine for the presence of occurrence of cracking.

(4) Surface Flatness

The surface of the gas barrier film on the side on which the polydimethylsiloxane layer and inorganic material layer were formed was observed using an atomic force microscope (AFM, Seiko Instruments Inc., trade name: SPA300 HV) followed by measurement of the center line average roughness (Ra) within the respective ranges of a 1 $\mu m^2$ square and a 25 $\mu m^2$ square.

(5) Adhesion Test

Adhesion was evaluated to one of six levels from 0 to 5 according to a cross-cut test using cellophane tape in compliance with JIS-K5600-5-6. Furthermore, the larger the indicated value, the poorer the adhesion. The results of the aforementioned evaluations are shown in Table 2.

TABLE 2

|  | Water vapor permeability ($g/m^2/day$) | Water vapor permeability after folding test ($g/m^2/day$) | Occurrence of Cracking after bending test | Surface flatness Ra (nm) | | Adhesion test (0-5) |
|---|---|---|---|---|---|---|
|  |  |  |  | 1 $\mu m^2$ | 25 $\mu m^2$ |  |
| Ex. 1 | 0.03 | 0.20 | No | 0.19 | 1.55 | 0 |
| Ex. 2 | 0.07 | 0.18 | No | 0.55 | 3.05 | 0 |
| Ex. 3 | 0.03 | 0.26 | No | 0.33 | 2.07 | 0 |
| Ex. 4 | 0.10 | 0.35 | No | 0.45 | 3.08 | 0 |
| Ex. 5 | 0.01 | 0.10 | No | 0.10 | 1.99 | 0 |
| Ex. 6 | 0.02 | 0.17 | No | 0.20 | 1.59 | 0 |
| Ex. 7 | 0.03 | 0.15 | No | 0.23 | 1.66 | 0 |
| Comp. Ex. 1 | 0.55 | 1.21 | Yes | 1.60 | 13.2 | 1 |
| Comp. Ex. 2 | 0.33 | 0.92 | No | 1.00 | 15.3 | 0 |
| Comp. Ex. 3 | 0.40 | 1.50 | Yes | 0.78 | 10.9 | 4 |
| Comp. Ex. 4 | 0.30 | 0.80 | No | 1.78 | 16.8 | 0 |
| Comp. Ex. 5 | 0.23 | 1.24 | Yes | 0.67 | 9.89 | 4 |
| Comp. Ex. 6 | 0.03 | 0.82 | No | 0.70 | 13.7 | 0 |
| Comp. Ex. 7 | 0.62 | 1.05 | No | 0.50 | 15.0 | 1 |
| Ref. Ex. 1 | 0.60 | 0.80 | No | 0.30 | 3.80 | 0 |

As shown in Table 2, the gas barrier films produced in Examples 1 to 7 had low water vapor permeability and low water vapor permeability after the folding test and demonstrated superior gas barrier properties. In addition, the occurrence of cracking in the inorganic material layer was not observed during the bending test, layer adhesion was superior and surface flatness was high. In addition, in Examples 6 and 7 in which a fluorine-containing resin layer was provided on the other side, gas barrier properties were further improved as compared with Example 1.

In contrast, the gas barrier film of Comparative Example 1, in which only an inorganic material layer was deposited by sputtering method without forming a polydimethylsiloxane layer, had high water vapor permeability and cracks occurred in the inorganic material layer after the bending test. In addition, layer adhesion was inferior and surface flatness was low. In addition, although the gas barrier films of Comparative Examples 2 and 4, in which a polydimethylsiloxane layer was not formed, inhibited the occurrence of cracking after the bending test and demonstrated favorable layer adhesion, water vapor permeability was high and surface flatness was inferior.

Moreover, although the gas barrier films of Comparative Examples 3 and 5, in which a urethane acrylate layer was formed instead of the polydimethylsiloxane layer, demonstrated somewhat high surface flatness, all other properties were inferior.

Moreover, the gas barrier film of Comparative Example 6, in which ions were implanted in the polydimethylsiloxane layer and the inorganic material layer was deposited by sputtering method, and the gas barrier film of Comparative Example 7, in which the inorganic material layer was deposited by sputtering method followed by ion implantation, both demonstrated low surface flatness.

INDUSTRIAL APPLICABILITY

According to the gas barrier film of the present invention, since surface irregularities in the surface of a base are filled in by a layer containing a polyorganosiloxane-based compound provided on the base, the shape of the surface irregularities is inhibited from appearing on the surface of the base. Consequently, in addition to demonstrating superior surface flatness and gas barrier properties, a gas barrier film have superior layer adhesion and is resistant to occurrence of cracking when the film is bent, and an electronic device can be applied that is provided therewith.

BRIEF DESCRIPTION OF THE REFERENCE SYMBOLS

10,20,30: gas barrier film, 11: base, 12: polyorganosiloxane layer, 13: inorganic material layer, 14: fluorine-containing resin layer, 15: adhesive, 100,200: solar cell module, 101,201: solar cell, 102,202: encapsulant, 103,203: front protective sheet (front sheet), 104,204: back protective sheet (back sheet)

The invention claimed is:

1. A method of producing a gas barrier film, comprising:
   forming a layer containing a polyorganosiloxane-based compound on a base,
   subsequently, forming an inorganic material layer on the layer containing the polyorganosiloxane-based compound by dynamic ion mixing method,
   wherein the dynamic ion mixing method is conducted with a negative pulsed high voltage applied to the base at a range of −20 kV to −1 kV; and
   the layer containing the polyorganosiloxane-based compound and the inorganic material layer are sequentially laminated on at least one side of the base.

2. The method of producing a gas barrier film according to claim 1, wherein an inorganic compound that composes the inorganic material layer is selected from at least one type of inorganic compound consisting of an elemental metal, silicon, graphite, inorganic oxide, inorganic nitride and inorganic oxynitride.

3. The method of producing a gas barrier film according to claim 2, wherein inorganic compound is selected from at least one type of inorganic compound consisting of silicon nitride, silicon oxide, aluminum oxide, aluminum nitride, aluminum oxynitride, indium oxide and tin-doped indium oxide.

4. The method of producing a gas barrier film according to claim 1, wherein a plasma-forming gas used in the dynamic ion mixing method contains at least one type of gas selected from the group consisting of helium, argon, neon, krypton and xenon.

5. The method of producing a gas barrier film according to claim 4, wherein the plasma-forming gas used in the dynamic ion mixing method is a mixed gas further containing at least one type of gas selected from the group consisting of hydrogen, oxygen, nitrogen and fluorocarbons.

6. The method of producing a gas barrier film according to claim 1, wherein the thickness of the layer containing a polyorganosiloxane-based compound is prepared to be in the range of 0.01 μm to 100 μm.

7. The method of producing a gas barrier film according to claim 1, wherein the polyorganosiloxane-based compound of the layer is polydimethylsiloxane.

8. The method of producing a gas barrier film according to claim 1, wherein a layer containing a fluorine-containing resin is provided on the base on the side opposite the side where the layer containing a polyorganosiloxane-based compound is formed.

9. The method of producing a gas barrier film according to claim 1, wherein the content of the polyorganosiloxane-based compound in the layer is 50% by weight or more of the layer.

10. The method of producing a gas barrier film according to claim 1, wherein the thickness of the inorganic material layer is prepared to be in the range of 10 nm to 1000 nm.

11. An electronic device comprising a gas barrier film produced by the method according to claim 1.

12. The electronic device according to claim 11, wherein the electronic device is a solar cell module.

13. The electronic device according to claim 12, wherein the gas barrier film is used as a back protective sheet.

14. The electronic device according to claim 11, wherein the electronic device is an image display element.

15. The method of producing a gas barrier film according to claim 1, wherein the dynamic ion mixing method is conducted by applying a radio frequency electrical power to the base, plasma-forming gas is plasmatized around the base, argon ions in the plasma collide with a target, and particles are scattered from the target, the scattered particles adhered to the surface of the layer containing the polyorganosiloxane-based compound and are deposited thereon resulting in the formation of a deposited film of particles.

16. The method of producing a gas barrier film according to claim 1, wherein the pressure of the plasma-forming gas is $1.0 \times 10^1$ to $1.0 \times 10^{-3}$ Pa.

17. The method of producing a gas barrier film according to claim 1, wherein the concentration of ions implanted in the film is $1 \times 10^{15}$ ions/cm$^2$ or more.

18. The method of producing a gas barrier film according to claim 1, wherein the concentration of ions implanted in the film is $1 \times 10^{16}$ to $1 \times 10^{18}$ ions/cm$^2$.

19. The method of producing a gas barrier film according to claim 1, wherein the thickness of the inorganic material layer is 50 nm to 200 nm.

* * * * *